(12) United States Patent
Sharma

(10) Patent No.: US 12,666,956 B2
(45) Date of Patent: Jun. 23, 2026

(54) INCORPORATION OF SUPERLATTICE SEMI-METALS FOR SCALED INTERCONNECTS

(71) Applicant: Intel Corporation, Santa Clara, CA (US)

(72) Inventor: Abhishek Anil Sharma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 17/958,284

(22) Filed: Sep. 30, 2022

(65) Prior Publication Data

US 2024/0113027 A1 Apr. 4, 2024

(51) Int. Cl.
*H10W 20/44* (2026.01)
*H10W 20/00* (2026.01)
(Continued)

(52) U.S. Cl.
CPC ..... *H10W 20/4446* (2026.01); *H10W 20/063* (2026.01); *H10W 20/0633* (2026.01); *H10W 20/42* (2026.01); *H10W 20/425* (2026.01); *H10W 20/435* (2026.01); *H10W 20/039* (2026.01)

(58) Field of Classification Search
CPC ..... H01L 21/823475; H01L 21/823871; H01L 21/76885; H01L 21/76895; H01L 21/76897; H01L 21/76804; H01L 21/76805; H01L 21/76816; H01L 21/76877; H01L 23/5226; H01L 23/5283; H01L 23/5286; H01L 23/528; H01L 23/481; H01L 23/535; H01L 23/5384; H01L 23/5386; H01L 23/53204–53285; H01L 21/76841–76865; H10D 84/0149; H10D 84/0186; H10D 84/038; H10W 70/65–658; H10W 20/063–0636; H10W 20/069–0698; H10W 20/082–089; H10W 20/056; H10W 20/0595; H10W 20/057; H10W 20/42–422; H10W 20/435; H10W 20/427; H10W 20/43;
(Continued)

(56) References Cited

U.S. PATENT DOCUMENTS

2006/0281306 A1* 12/2006 Gstrein ............. H01L 23/53276 257/E21.585
2012/0006580 A1* 1/2012 Sandhu ............. H01L 21/76865 977/734
(Continued)

OTHER PUBLICATIONS

Thickness of graphene and single-wall carbon nanotubes, Physical Review B 74, 245413 (Year: 2006).*

*Primary Examiner* — Younes Boulghassoul
(74) *Attorney, Agent, or Firm* — Schwabe, Williamson & Wyatt, P.C.

(57) ABSTRACT

Embodiments disclosed herein include an integrated circuit structure. In an embodiment, the integrated circuit structure comprises an interlayer dielectric (ILD). and an interconnect over the ILD. In an embodiment, the interconnect comprises a plurality of first layers, where the first layers comprise a metal, and a plurality of second layer in an alternating pattern with the plurality of first layers. In an embodiment, the second layers comprise a two-dimensional (2D) material.

20 Claims, 12 Drawing Sheets

(51) Int. Cl.
  *H10W 20/41*          (2026.01)
  *H10W 20/42*          (2026.01)
(58) Field of Classification Search
  CPC ........... H10W 20/20–233; H10W 20/44–4446;
  H10W 20/425
  See application file for complete search history.

(56)                    References Cited

U.S. PATENT DOCUMENTS

| | | | |
|---|---|---|---|
| 2020/0035560 A1* | 1/2020 | Block ................ | H10D 84/0186 |
| 2020/0211974 A1* | 7/2020 | Sato ................. | H10W 20/4403 |
| 2022/0181256 A1* | 6/2022 | Gomes .................... | H01L 25/18 |
| 2023/0051311 A1* | 2/2023 | Niimi ...................... | H10P 14/44 |
| 2023/0223344 A1* | 7/2023 | Chin .................... | H10W 20/20 |
| 2023/0317605 A1* | 10/2023 | Sharma .............. | H10W 20/435 |
| | | | 257/351 |
| 2024/0113025 A1* | 4/2024 | Sharma ................ | H10W 20/42 |

* cited by examiner

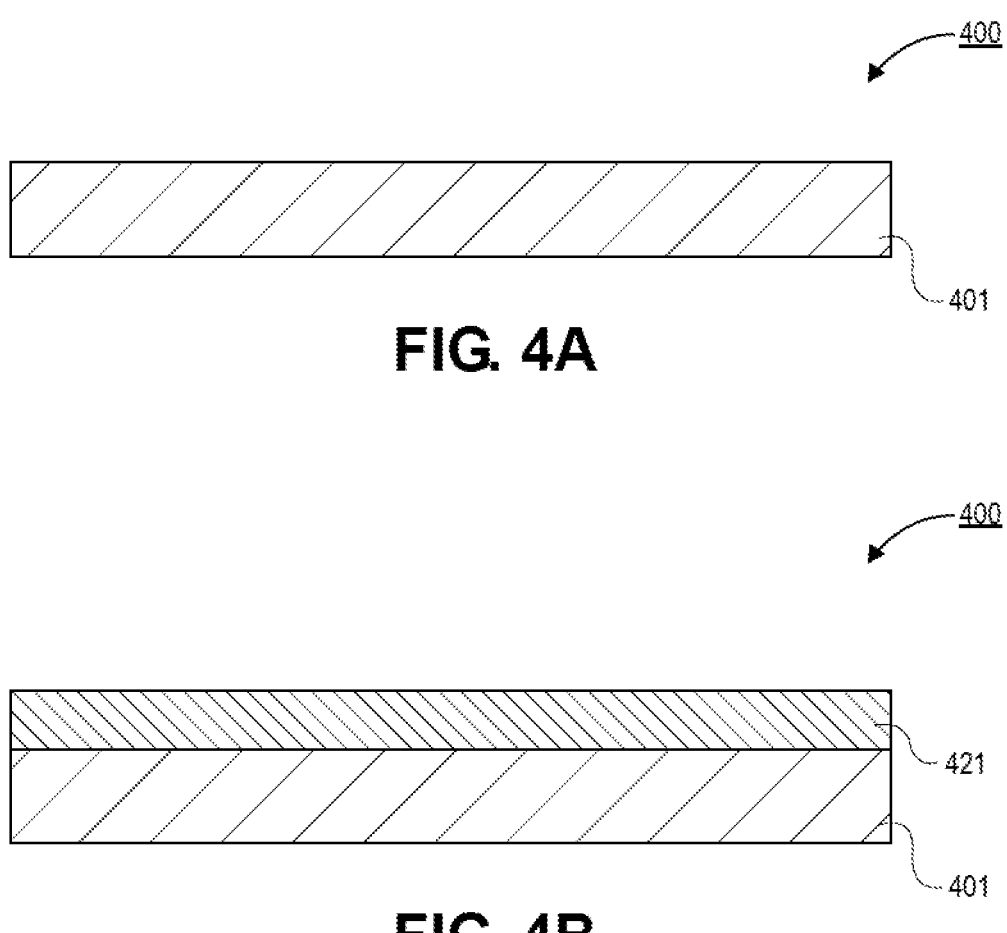
400
401
FIG. 4A
400
421
401
FIG. 4B
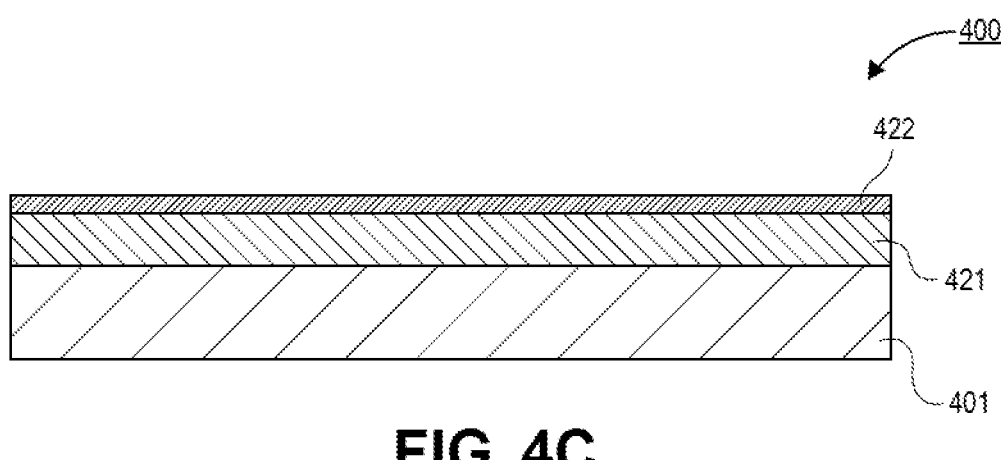
400
422
421
401
FIG. 4C

500

570

568

566 { DV

572

CARRIER WAFER

M12
M11
M10
M9
M8
M7
M6
M5
M4/V3
M3/V2
M2/V1
M1
V0
M0
VCX/TCN/GCN
FETS
BM0
BM1
~GM0        BM2
MIM
~GM1        BM3
BUMP

564

562

INCORPORATION OF SUPERLATTICE SEMI-METALS FOR SCALED INTERCONNECTS

TECHNICAL FIELD

Embodiments of the disclosure are in the field of semiconductor structures and processing and, in particular, to superlattice interconnects and via architectures for low temperature conduction.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Another aspect driving innovation is the drive for high bandwidth (HBW) computing.

BRIEF DESCRIPTION OF THE DRAWINGS

FIGS. 4A-4H are cross-sectional illustrations depicting a process for forming a superlattice interconnect, in accordance with an embodiment.

DESCRIPTION OF THE EMBODIMENTS

Figures 1, 2A:
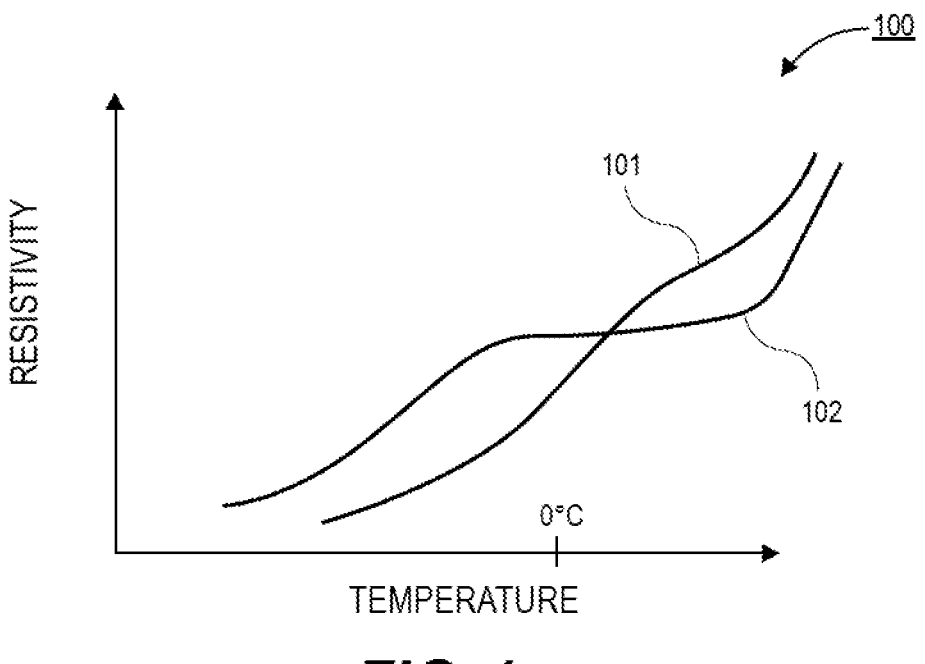
FIG. 1 is a graph of electrical conductivity versus temperature for different materials, in accordance with an embodiment.
FIG. 2A is a cross-sectional illustration of an integrated circuit structure with a superlattice interconnect, in accordance with an embodiment.

Embodiments described herein comprise superlattice interconnects and via architectures for low temperature conduction and methods of forming such interconnects and vias. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In order to provide context, high bandwidth (HBW) computing may use low temperatures (e.g., below 0 degrees Celsius) in order to provide improved computing performance of the transistors. However, traditional interconnect materials (e.g., copper and the like) do not have high electrical conductivity at such low temperatures. As such, electrical performance and efficiency of computing systems operating at such temperatures is diminished. Accordingly, embodiments disclosed herein include hybrid interconnect architectures that leverage the low temperature electrical conductivity of two dimensional (2D) materials such as, semi-metals or transition metal dichalcogenides (TMDs). A graph of the electrical conductivity versus temperature for generic classes of materials is shown in FIG. 1. As shown, the bulk metal materials 101 typically have a high conductivity at temperatures above 0 degrees Celsius, but quickly reduce in conductivity below 0 degrees Celsius. In contrast, 2D materials, such as semi-metals or TMD materials 102, have electrical conductivity that is lower than the bulk metals above 0 degrees Celsius, but higher electrical conductivity than the bulk metals below 0 degrees Celsius.

In a particular embodiment, the hybrid interconnect architectures comprise a superlattice configuration. In the superlattice configuration there may be alternating first layers and second layers. The first layers may be bulk conductive material and the second layers may be 2D materials, such as semi-metals or TMDs. Any number of first layers and second layers may be provided in an alternating pattern. Such an embodiment may include first layers that are thicker than the second layers. For example, the second layers may have a thickness that is one monolayer thick or several monolayers thick, and the first layers may have a thickness between approximately 1 nm and approximately 50 nm. As used herein, "approximately" may refer to a range of values within ten percent of the stated value. For example, approximately 1 nm may refer to a range between 0.9 nm and 1.1 mnm.

As used throughout this disclosure 2D materials may refer to low temperature conduction materials. That is, the 2D materials may have a relatively high electrical conduction at temperatures around 0 degrees Celsius or less. For example, the 2D materials may include semi-metals, TMDs, or the like. Examples of TMDs include materials that comprise a transition metal (e.g., tungsten, molybdenum, etc.) that are combined with a chalcogen (e.g., sulfur, selenium, tellurium, etc.). Monolayers of TMDs may be approximately 0.4 nm thick or less. In an embodiment, several monolayers may be stacked on each other to provide a 2D material that has a thickness up to approximately 2 nm.

As used herein, hybrid interconnects may refer to interconnects that are provided in the front-side or the backside of an integrated circuit structure. That is, the hybrid interconnects may be provided above or below a device layer that comprises transistor devices (e.g., nanowire-based transistors, nanoribbon-based transistors, nanosheet-based transistors, or fin-based transistors). Additionally, the hybrid interconnects may be used in any of the metal layers of the integrated circuit structure. The entirety of the interconnect architecture may include hybrid interconnects, or select portions of the interconnect architecture may include hybrid interconnects. As used herein, an interconnect may refer to a pad, a trace, a via, or the like.

Referring now to FIG. 2A, a cross-sectional illustration of an integrated circuit (IC) structure 200 with a hybrid interconnect 220 is shown, in accordance with an embodiment. The hybrid interconnect 220 may be provided over a first interlayer dielectric (ILD) 201 and embedded in a second ILD 202. In an embodiment, as used throughout the present description, ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, the hybrid interconnect 220 may comprise a superlattice structure. That is, the hybrid interconnect 220 may comprise alternating first layers 221 and second layers 222. The first layers 221 may be a bulk conductive material. The first layers 221 enable high electrical conduction at temperatures above approximately 0 degrees Celsius. The second layers 222 may be 2D materials, such as semi-metals or TMDs. More generally, suitable 2D materials may comprise sulphides, tellurides and selenides of Mo, W, Hf, Ti, Ta, Cu, Mo, Ni, Nb, Si, Ge, In, Zn, Sn, Sb, etc., black phosphorus, graphene, and carbon nanotubes The second layers 222 enable high electrical conduction at temperatures below approximately 0 degrees Celsius. In an embodiment, the first layers 221 comprise a transition metal, such as molybdenum or tungsten. The second layers 222 may include a TMD that has the same transition metal as the first layer 221 and a chalcogen. For example, when the first layers 221 comprise tungsten, the second layers 222 may comprise a TMD comprising tungsten and sulfur.

In an embodiment, the first layers 221 may have a first thickness and the second layers 222 may have a second thickness that is smaller than the first thickness. The first thickness may be between approximately 1 nm and approximately 50 nm, and the second thickness may be between approximately 0.4 nm (e.g., one monolayer thick) and approximately 2 nm (e.g., several monolayers thick). In the illustrated embodiment, the first layers 221 and the second layers 222 are provided in an alternating pattern. While three second layers 222 are shown in FIG. 2A, it is to be appreciated that there may be any number (i.e., one or more) second layers 222 in the hybrid interconnect 220. In the illustrated embodiment, the hybrid interconnect 220 has a substantially rectangular cross-section. Though, as will be described in greater detail below, embodiments are not limited to such configurations. In an embodiment, the hybrid interconnect 220 may be patterned with a subtractive etching process. Methods of forming the hybrid interconnect 220 are described in greater detail below.

Figure 2B:
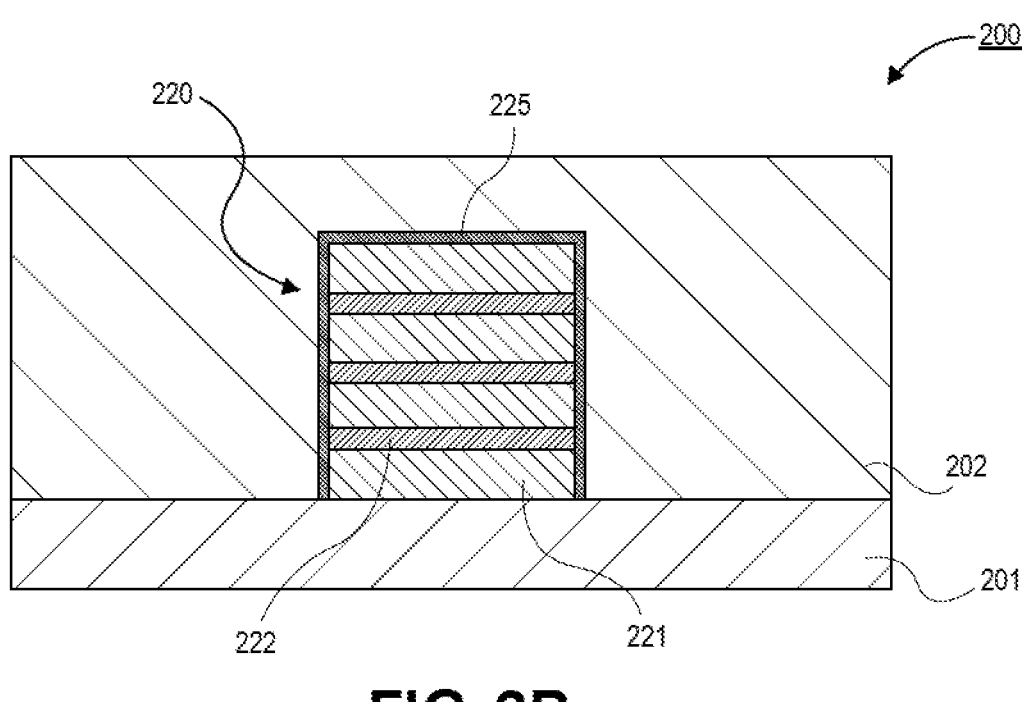
FIG. 2B is a cross-sectional illustration of an integrated circuit structure with a superlattice interconnect with a barrier layer, in accordance with an embodiment.

Referring now to FIG. 2B, a cross-sectional illustration of an IC structure 200 is shown, in accordance with an additional embodiment. In an embodiment, the IC structure 200 in FIG. 2B may be substantially similar to the IC structure 200 in FIG. 2A, with the exception of the formation of a barrier layer 225 over the hybrid interconnect 220. In an embodiment, the barrier layer 225 may comprise a 2D material in some embodiments. The barrier layer 225 may comprise the same material as the second layers 222 in some embodiments. In other embodiments, the barrier layer 225 may be a different material than the second layers 222. The barrier layer 225 may have a thickness that is between approximately 0.4 nm and approximately 2 nm. The barrier layer 225 covers sidewalls and a top surface of the hybrid interconnect 220.

Figure 2C:
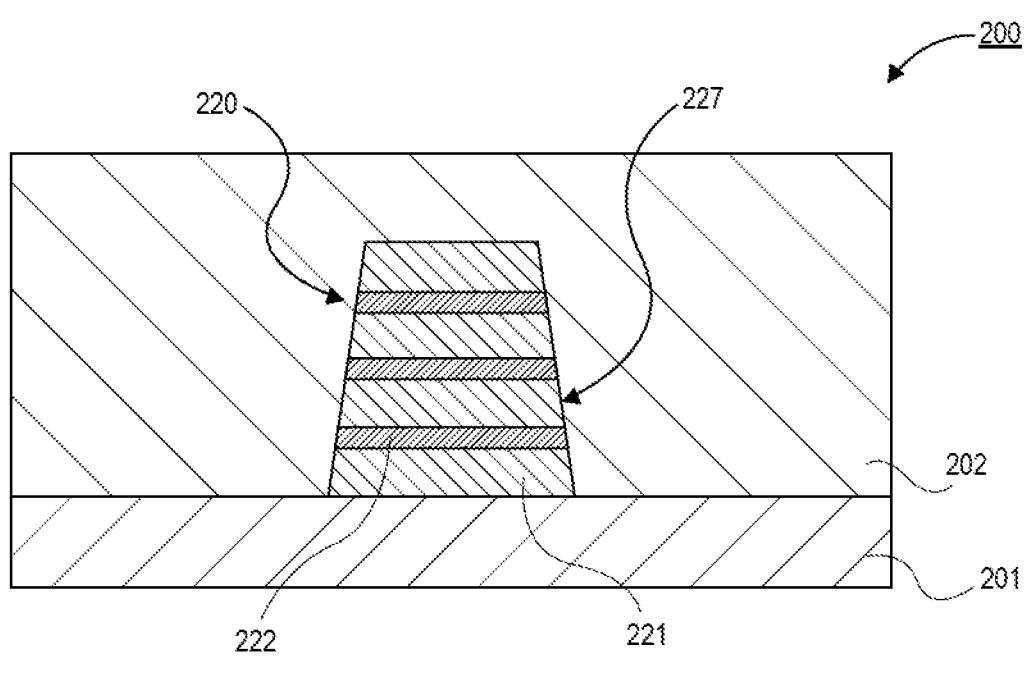
FIG. 2C is a cross-sectional illustration of an integrated circuit structure with a superlattice interconnect with tapered sidewalls, in accordance with an embodiment.

Referring now to FIG. 2C, a cross-sectional illustration of an IC structure 200 is shown, in accordance with an additional embodiment. In an embodiment, the IC structure 200 in FIG. 2C is substantially similar to the IC structure 200 in FIG. 2A, with the exception of the cross-section of the hybrid interconnect 220. Instead of being rectangular, the cross-section of the hybrid interconnect 220 in FIG. 2C is trapezoidal. That is, sidewalls 227 of the hybrid interconnect 220 are sloped. In an embodiment, a top of the hybrid interconnect 220 may be narrower than a bottom of the hybrid interconnect 220. The sloped sidewalls 227 may be the result of an etching process used to manufacture the hybrid interconnect 220.

Figure 2D:
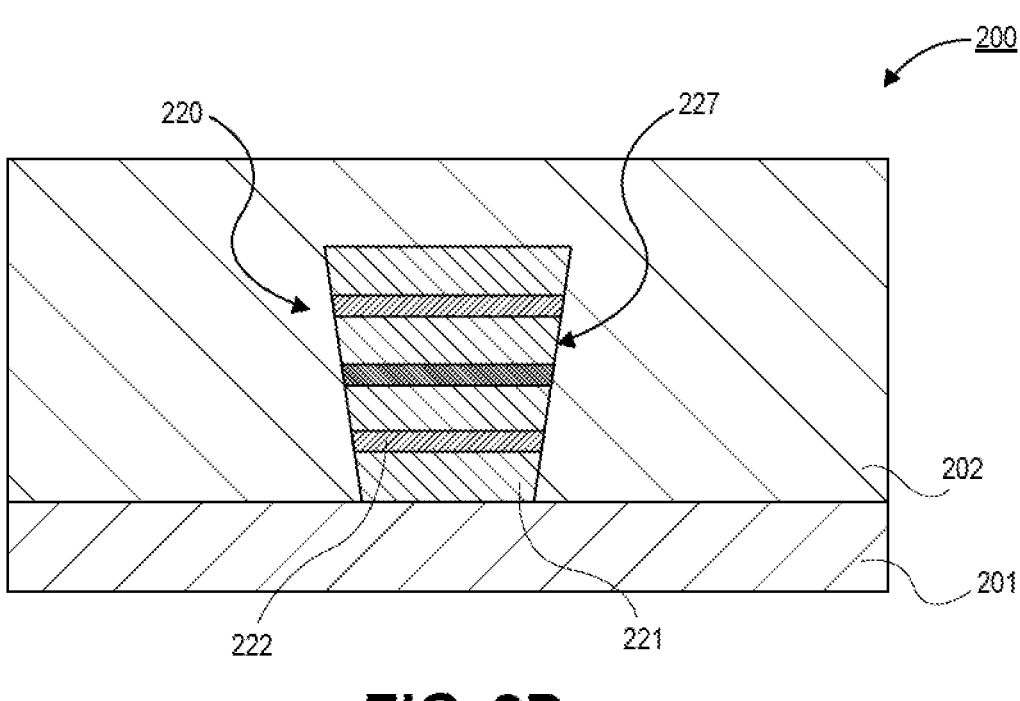
FIG. 2D is a cross-sectional illustration of an integrated circuit structure with a superlattice interconnect with tapered sidewalls, in accordance with an additional embodiment.

Referring now to FIG. 2D, a cross-sectional illustration of an IC structure 200 is shown, in accordance with an additional embodiment. In an embodiment, the IC structure 200 in FIG. 2D is substantially similar to the IC structure 200 in FIG. 2A, with the exception of the cross-section of the hybrid interconnect 220. Instead of being rectangular, the cross-section of the hybrid interconnect 220 in FIG. 2D is trapezoidal. That is, sidewalls 227 of the hybrid interconnect 220 are sloped. In an embodiment, a bottom of the hybrid interconnect 220 may be narrower than a top of the hybrid interconnect 220. The sloped sidewalls 227 may be the result of an etching process used to manufacture the hybrid interconnect 220.

Figure 2E:
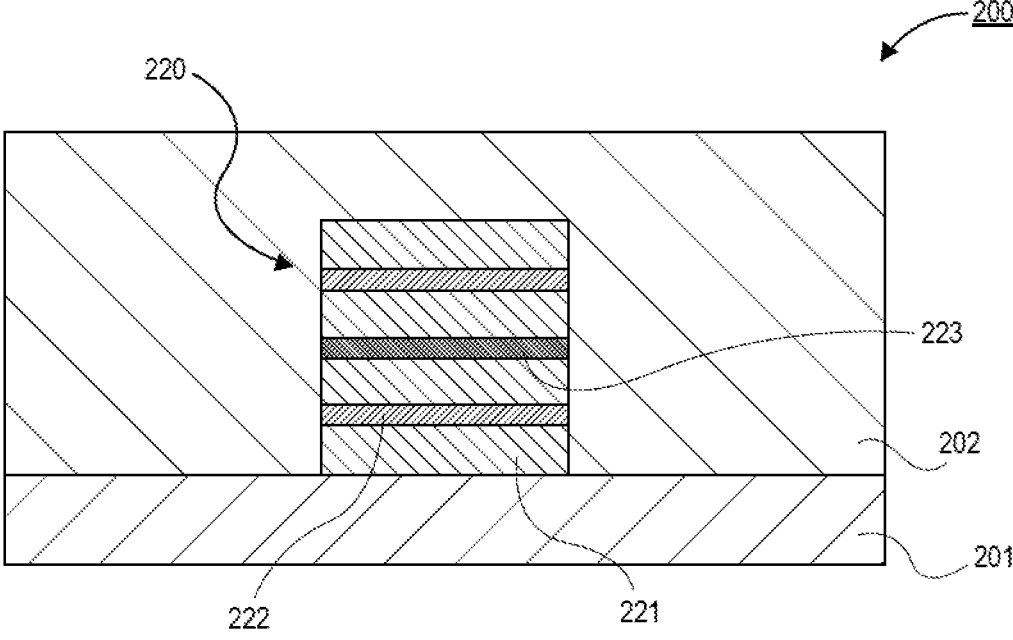
FIG. 2E is a cross-sectional illustration of an integrated circuit structure with a superlattice interconnect that includes three different material layers, in accordance with an embodiment.

Referring now to FIG. 2E, a cross-sectional illustration of an IC structure 200 is shown, in accordance with an additional embodiment. In an embodiment, the IC structure 200 in FIG. 2E is substantially similar to the IC structure 200 in FIG. 2A, with the exception of the second layers 222. Instead of having only first layers 221 and second layers 222, the embodiment shown in FIG. 2E further includes a third layer 223. The third layer 223 may replace one of the second layers 222 in the superlattice structure. The third layer 223 may also be a 2D material, and the third layer 223 may be a different material than the second layers 222. In the illustrated embodiment, a single third layer 223 is shown. However, it is to be appreciated that any number of third layers 223 may be provided in the superlattice structure.

Figure 3:
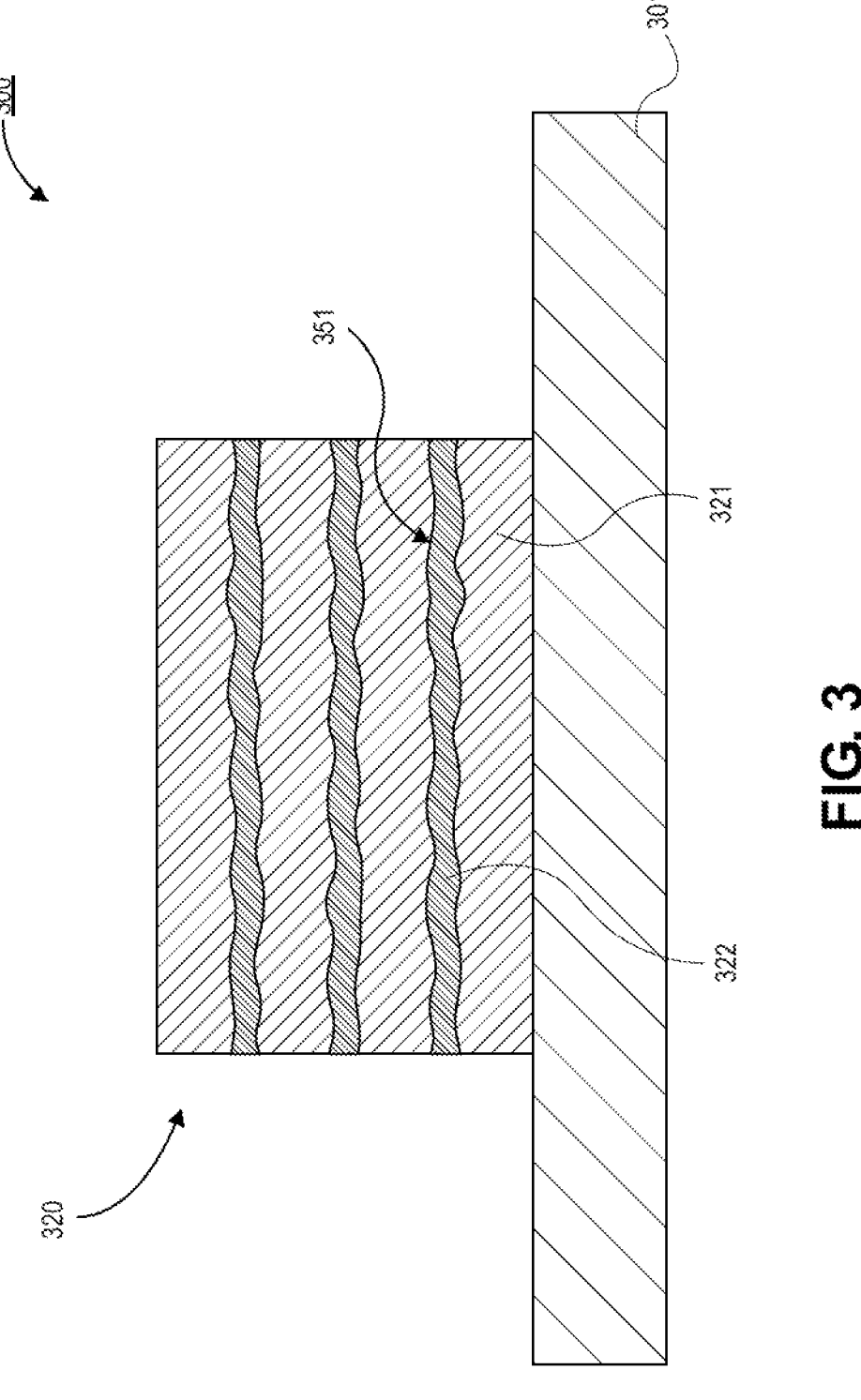
FIG. 3 is a cross-sectional illustration of an integrated circuit structure with a superlattice interconnect, in accordance with an embodiment.

Referring now to FIG. 3, a cross-sectional illustration of an IC structure 300 is shown, in accordance with an embodiment. In an embodiment, the IC structure 300 may comprise an ILD 301 with a hybrid interconnect 320 over the ILD 301. The hybrid interconnect 320 may comprise a superlattice of alternating first layers 321 and second layers 322. However, as opposed to the substantially rectangular layers described above, the second layers 322 may have a non-planar interface 351 with the first layers 321. That is, when viewed with a high magnification, there may be an undulating interface 351 between the first layers 321 and the second layers 322. The undulating interface 351 may be the result of the processing operations used to form the second layers 322. Particularly, the consumption of the first layers 321 may be non-uniform across the surface of the first layers 321 during the formation of the second layers 322, which may lead to an undulating interface.

Referring now to FIGS. 4A-4H, a series of cross-sectional illustrations depicting a process for forming an IC structure 400 with a hybrid interconnect 420 is shown, in accordance with an embodiment. As shown, a superlattice of first layers 421 and second layers 422 is formed first. Then, an etching process is used to define the hybrid interconnects 420.

Referring now to FIG. 4A, a cross-sectional illustration of an IC structure 400 at a stage of manufacture is shown, in accordance with an embodiment. In an embodiment, the IC structure 400 may comprise an ILD 401. The ILD 401 may be in the front-side or the backside of the IC structure 400. The ILD 401 may be provided over underlying ILD layers that may include additional conductive routing.

Referring now to FIG. 4B, a cross-sectional illustration of the IC structure 400 after a first layer 421 is formed over the ILD 401 is shown, in accordance with an embodiment. In an embodiment, the first layer 421 may comprise a bulk electrically conductive material. In a particular embodiment, the first layer 421 may comprise a transition metal, such as molybdenum or tungsten. In an embodiment, the first layer 421 may have a thickness that is between approximately 1 nm and approximately 50 nm. The first layer 421 may be deposited with any suitable deposition process, such as ALD, CVD, PVD, or the like.

Referring now to FIG. 4C, a cross-sectional illustration of the IC structure 400 after a second layer 422 is formed over the first layer 421 is shown, in accordance with an embodiment. In an embodiment, the second layer 422 may comprise a 2D material, such as a semi-metal or a TMD. The second layer 422 may be formed by flowing a gas over the first layer 421. The gas may interact with the first layer 421 (e.g., through diffusion, etc.) to form the second layer 422. As such, some of the first layer 421 may be consumed to form the second layer 422. For example, when a sulfur-based second layer 422 is grown, a sulfurization process may be used to form the second layer 422. In an embodiment, the second layer 422 may have a thickness between approximately 0.4 nm and approximately 2 nm.

Figures 4D, 4E, 4F:
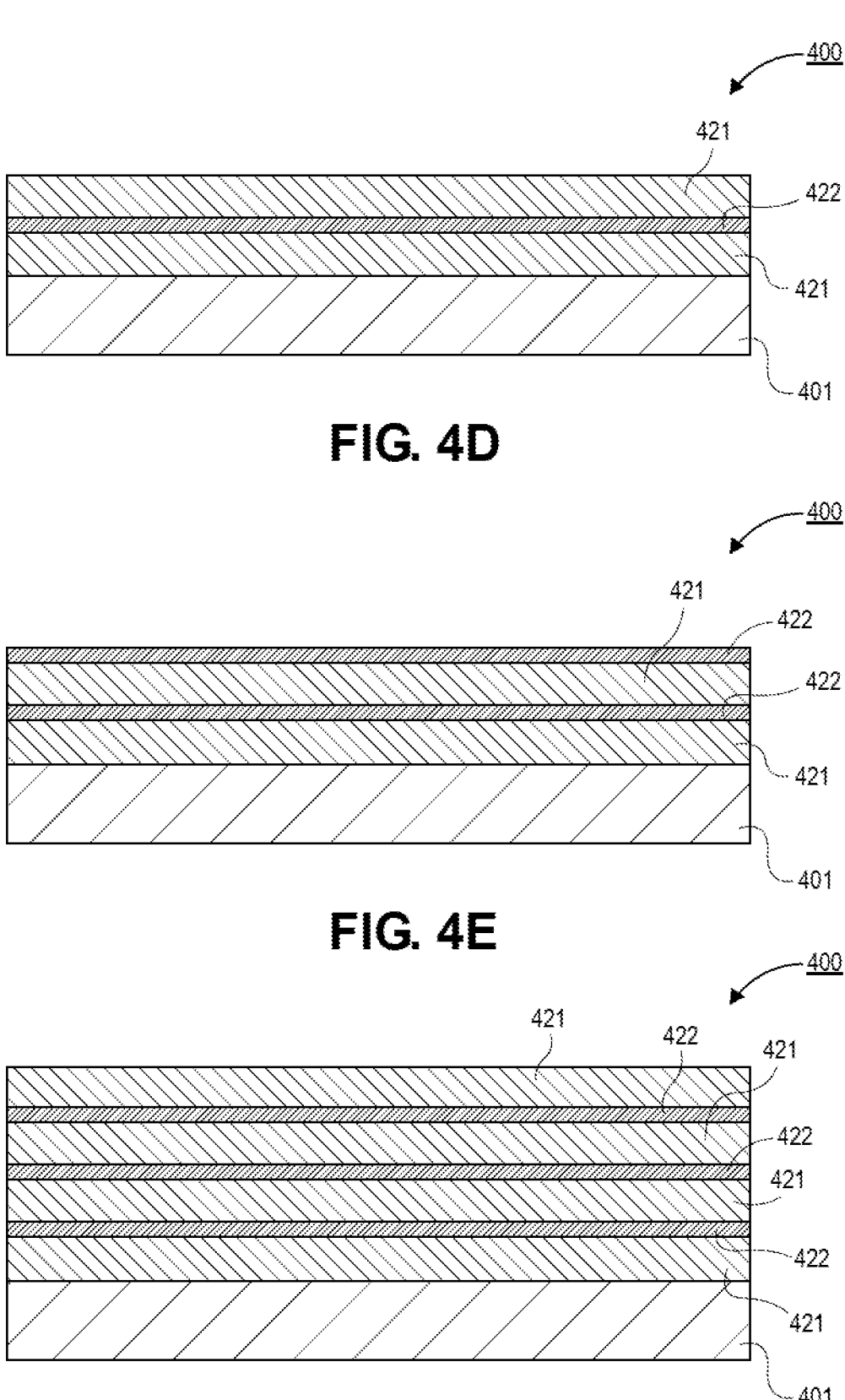

Referring now to FIG. 4D, a cross-sectional illustration of the IC structure 400 after a first layer 421 is applied over the second layer 422 is shown, in accordance with an embodiment. The first layer 421 over the second layer 422 may be the same material as first layer 421 below the second layer 422. In other embodiments, the top first layer 421 may be a different material than the bottom first layer 421. In an embodiment, the thickness of the top first layer 421 may be between approximately 1 nm and approximately 50 nm. In an embodiment, the top first layer 421 may be deposited with a CVD, ALD, or PVD process.

Referring now to FIG. 4E, a cross-sectional illustration of the IC structure 400 after a second layer 422 is formed over the topmost first layer 421 is shown, in accordance with an embodiment. The second layer 422 may be formed with a process similar to the process described above with respect to FIG. 4C. For example, a sulfurization process or the like may be used to form the topmost second layer 422. The topmost second layer 422 may be the same material as the bottom second layer 422. In other embodiments, the topmost second layer 422 may be a different material than the bottom second layer 422. In an embodiment, the topmost second layer 422 may have a thickness between approximately 0.4 nm and approximately 2 nm.

Referring now to FIG. 4F, a cross-sectional illustration of the IC structure 400 after additional first layers 421 and second layers 422 are formed is shown, in accordance with an embodiment. While a total of three second layers 422 are shown, it is to be appreciated that any number of second layers 422 and first layers 421 may be formed in order to provide a desired structure. The additional first layers 421 and second layers 422 may be formed with processes similar to those described above with respect to FIGS. 4A-4E.

Figure 4G:
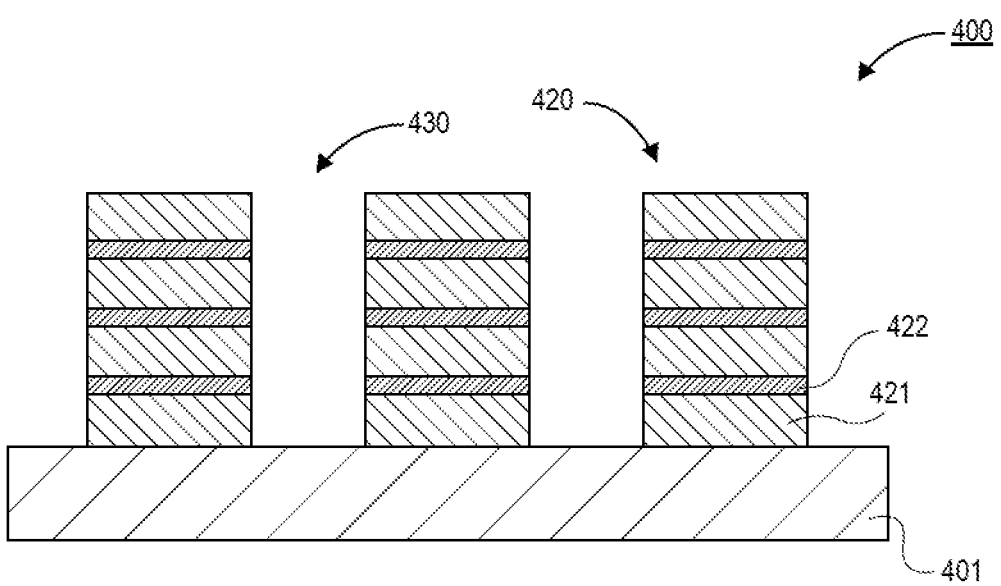

Referring now to FIG. 4G, a cross-sectional illustration of the IC structure 400 after trenches 430 are patterned into the first layers 421 and the second layers 422 is shown, in accordance with an embodiment. The trenches 430 define a plurality of hybrid interconnects 420 that are formed from the superlattice structure. In an embodiment, the trenches 430 may be formed with an etching process. In an embodiment, a mask layer (not shown) is used to define the hybrid interconnects 420.

Figure 4H:
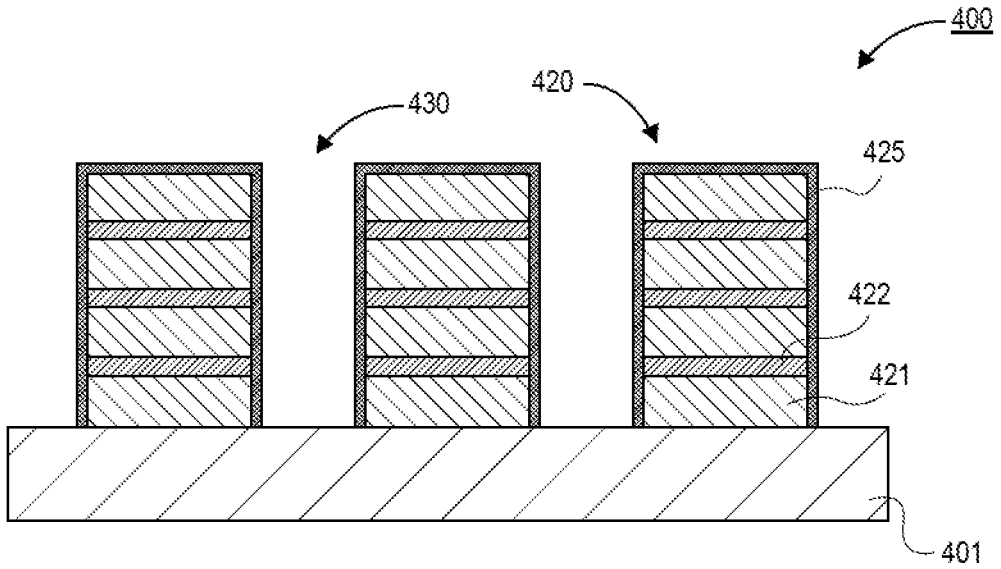

Referring now to FIG. 4H, a cross-sectional illustration of the IC structure 400 after a barrier layer 425 is formed around the hybrid interconnects 420 is shown, in accordance with an embodiment. In an embodiment, the barrier layer 425 may also comprise a 2D material. The barrier layer 425 may be the same material as the second layers 422, or the barrier layer 425 may be a different material than the second layers 422. The barrier layer 425 may have a thickness that is between approximately 0.4 nm and approximately 2 nm.

In the embodiments described above, an interconnect is shown in isolation of the remainder of the IC structure. Particularly, it is to be appreciated that the hybrid interconnects may be positioned at any location of the IC structure. For example, the hybrid interconnects may be provided on a front-side or a backside (i.e., above or below transistors) of the IC structure. Additionally, the hybrid interconnect may be used in any metal layer of the IC structure. In some embodiments, portions of the electrical routing may include hybrid interconnect structures, or substantially all of the electrical routing may include hybrid interconnect structures.

Figure 5:
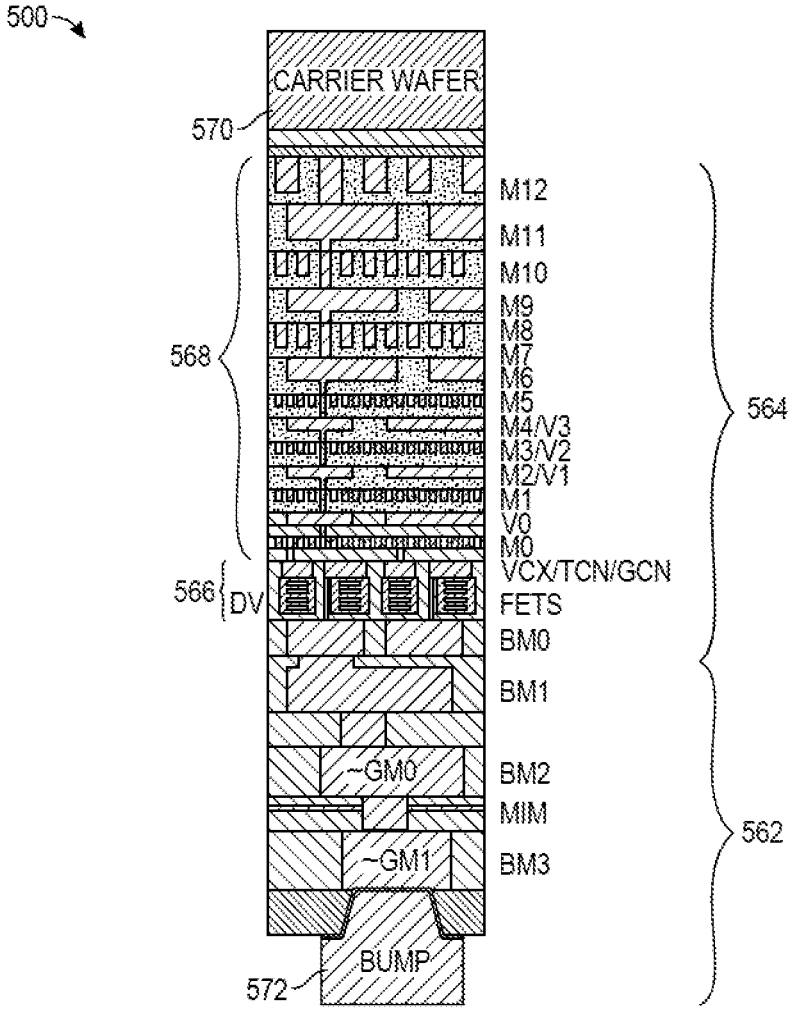
FIG. 5 is a cross-sectional illustration of an integrated circuit structure having a nanowire memory layer and backside power delivery, in accordance with an embodiment.

As an exemplary IC structure including signal lines as front-end lines and power structures in a backside, FIG. 5 illustrates a cross-sectional view of an IC structure having a nanowire memory layer and backside power delivery, in accordance with an embodiment of the present disclosure. It is to be appreciated that although nanowires (or nanoribbons or nanosheets) are depicted in FIG. 5, a fin-based architecture can also be used. In accordance with an embodiment of the present disclosure, energy consumption by the structure of FIG. 5 can be further reduced by using a low temperature conductive material such as described above in association with FIGS. 1-4H for one or more of the conductive lines, features or structures described below in association with FIG. 5.

Referring to FIG. 5, an IC structure 500 includes a front-side structure 564 on a backside structure 562. The front-side structure 564 includes a device layer 566, and a plurality of metallization layers 568 on the device layer 566. The structure 500 may be supported by a carrier wafer 570 on the front-side structure 564. The backside structure 562 includes a stack of backside conductive structures that terminate at a conductive bump 572.

In an embodiment, the device layer 566 includes Field Effect Transistors (FETs), such as nanowire-based (shown) or fin-based transistors. In one such embodiment, the FETs are used for memory. In an embodiment, the device layer 566 further includes trench contacts (TCN), gate contacts (GCN) and contact vias (VCX). In an embodiment, the device layer 566 is on a deep via (DV) layer of the front-side structure 564, as is depicted. In an embodiment, the plurality of metallization layers 568 includes increasing metal layer (e.g., M0-M12) and associated via layers (e.g., V0-V3 called out in FIG. 5).

In an embodiment, the backside structure 562 includes a plurality of backside metal layers (e.g., BM0-BM3) and associated vias. In an embodiment, the backside structure 562 includes one or more power structures, such as ground metal lines (e.g., GM0 and GM1). In an embodiment, the backside structure 562 includes one or more capacitor structures, such as a metal-insulator-metal (MIM) capacitor.

Figure 6:
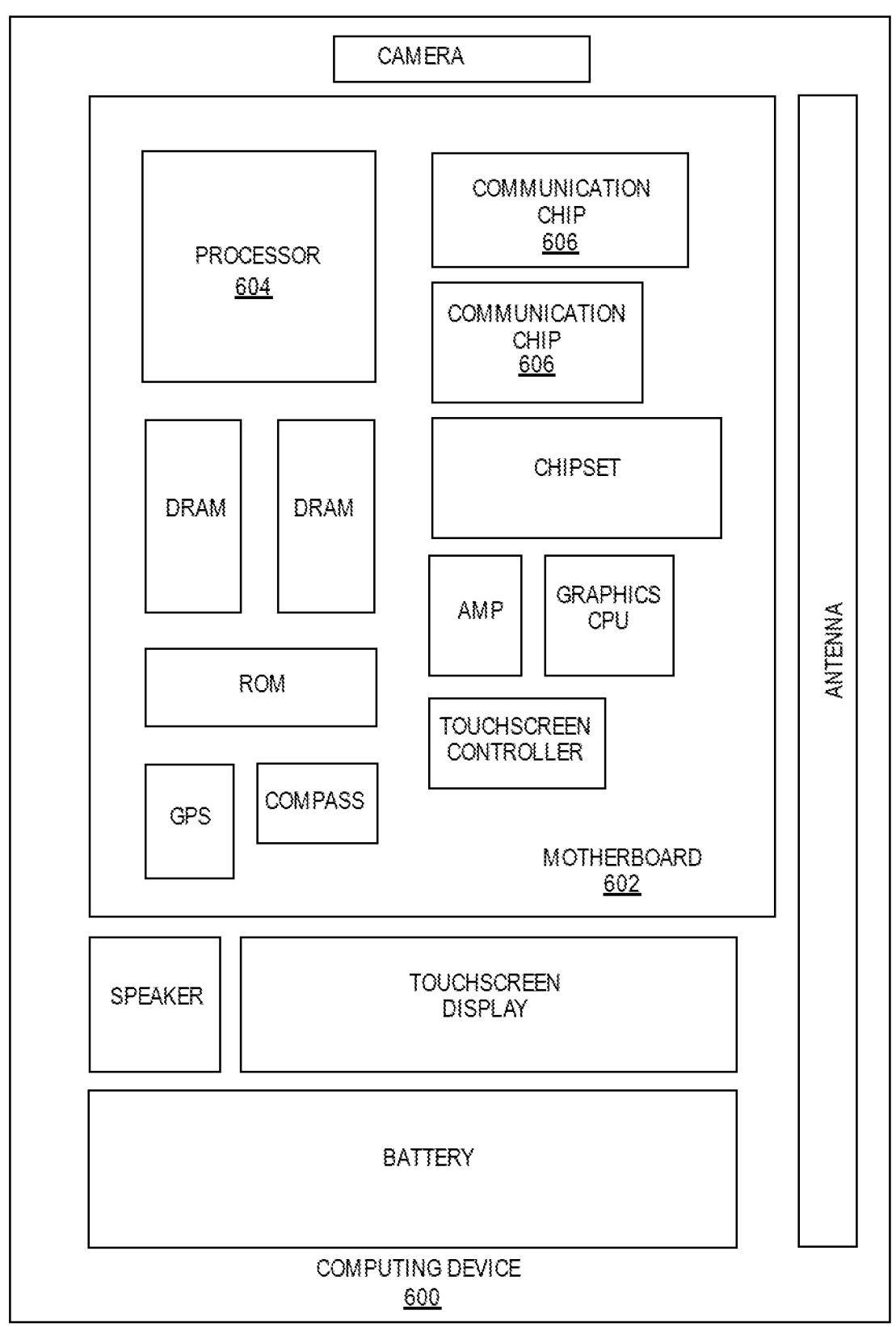
FIG. 6 illustrates a computing device in accordance with one implementation of an embodiment of the disclosure.

FIG. 6 illustrates a computing device 600 in accordance with one implementation of an embodiment of the present disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The integrated circuit die of the processor 604 may include one or more structures, such as gate-all-around integrated circuit structures having hybrid interconnect architectures, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. The integrated circuit die of the communication chip 606 may include one or more structures, such as gate-all-around integrated circuit structures having hybrid interconnect architectures, built in accordance with implementations of embodiments of the present disclosure.

In further implementations, another component housed within the computing device 600 may contain an integrated circuit die that includes one or structures, such as gate-all-around integrated circuit structures having hybrid interconnect architectures, built in accordance with implementations of embodiments of the present disclosure.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
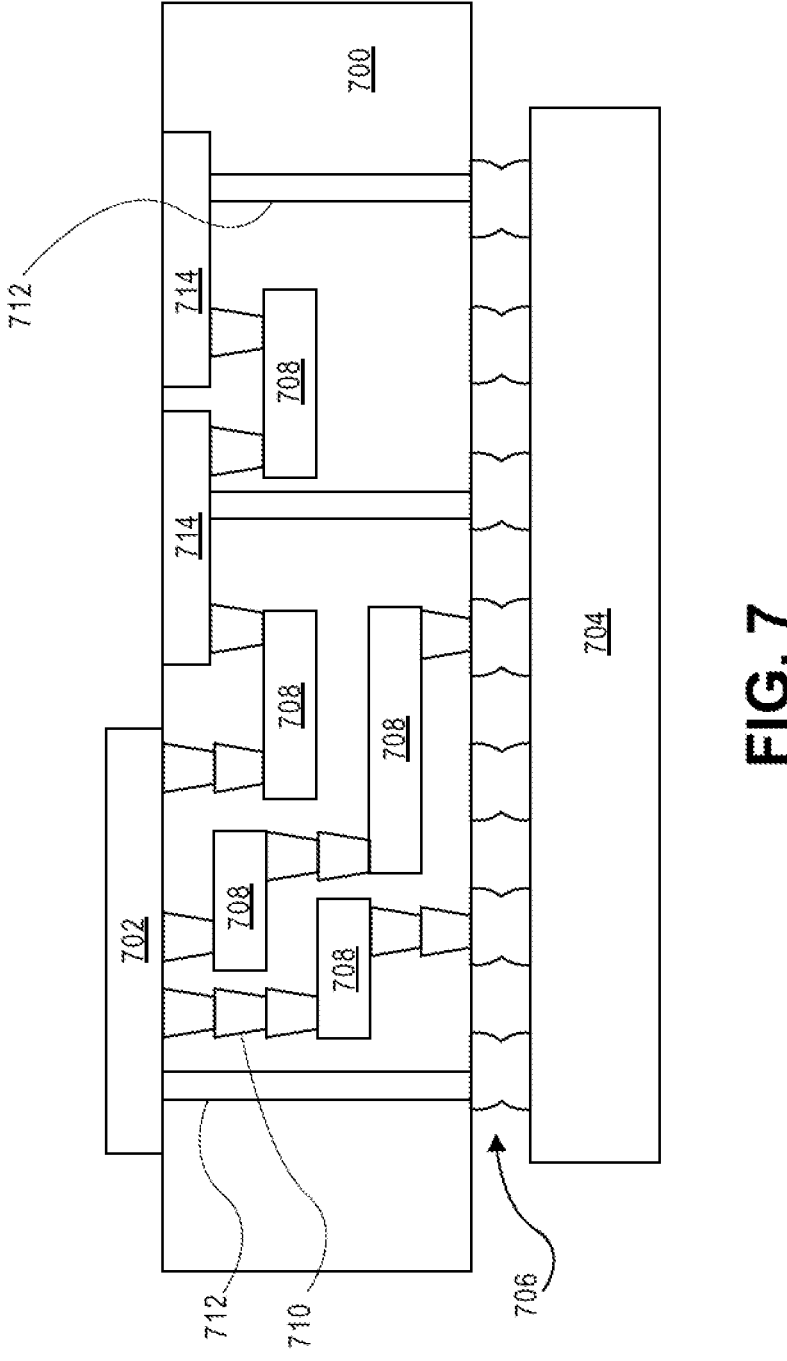
FIG. 7 illustrates an interposer that includes one or more embodiments of the disclosure.

FIG. 7 illustrates an interposer 700 that includes one or more embodiments of the present disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700 or in the fabrication of components included in the interposer 700.

It is to be appreciated that structures described herein may be operated at a low temperature, e.g., in a range of −77 degrees Celsius to 0 degrees Celsius. In one embodiment, a heat regulator/refrigeration device is coupled to a common board having a device with structures such as those described herein coupled thereto, such as described below in association with FIG. 8A. In one embodiment, a heat regulator device and/or refrigeration device is included on a processing device having structures such as those described herein, such as described below in association with FIG. 8B.

Figure 8A:
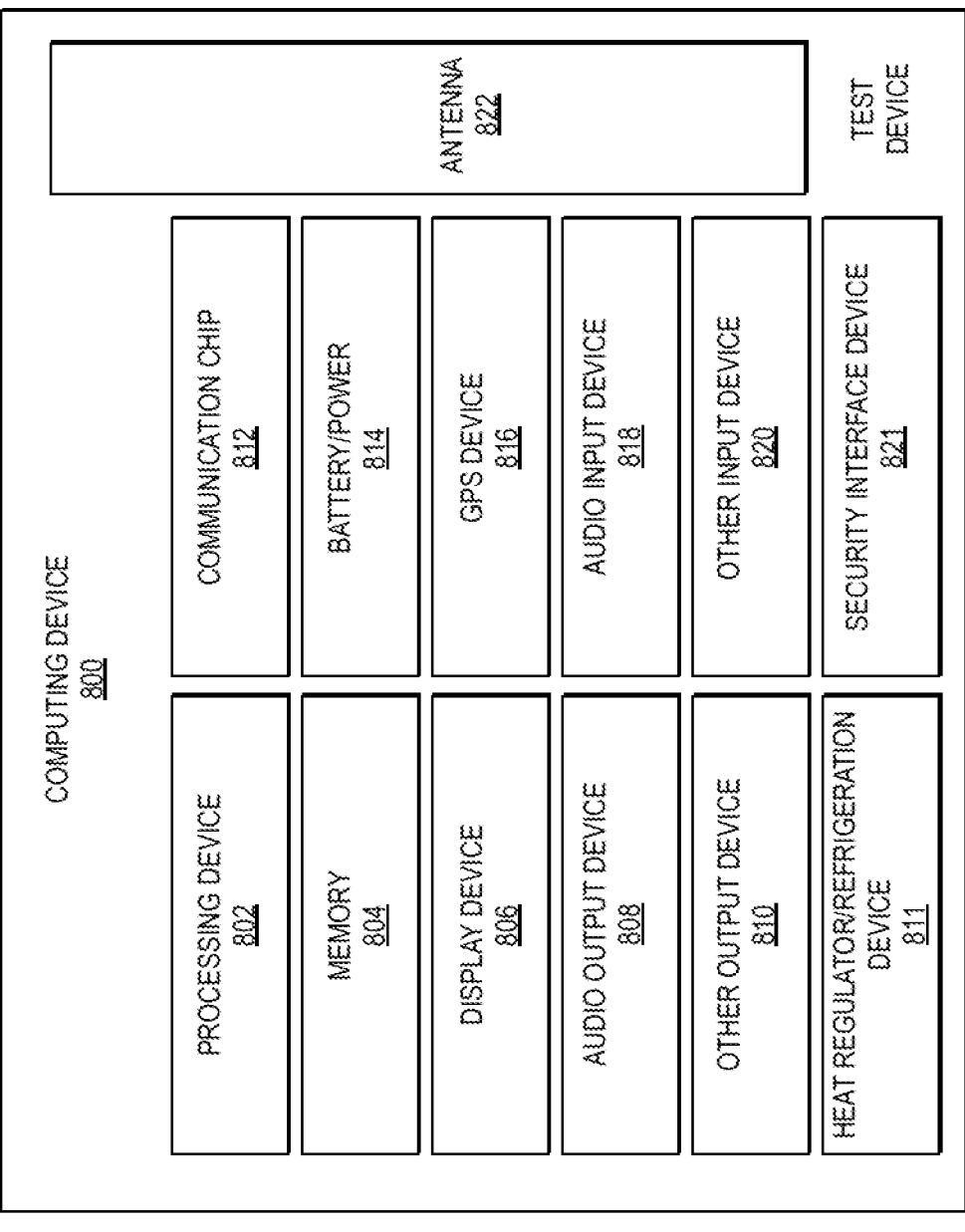
FIG. 8A illustrates a computing device in accordance with one implementation of an embodiment of the present disclosure.

FIG. 8A illustrates a computing device 800 in accordance with one implementation of an embodiment of the present disclosure. The computing device 800 houses a board. The board may include a number of components, including but not limited to a processing device 802. The computing device 800 can also include communication chip 812. In one embodiment, the processing device 802 is physically and electrically coupled to the board. In some implementations the communication chip 812 is also physically and electrically coupled to the board. In further implementations, the communication chip 812 is part of the processing device 802.

Depending on its applications, computing device 800 may include other components that may or may not be physically and electrically coupled to the board. These other components can include, but are not limited to, memory 804, such as volatile memory (e.g., DRAM), non-volatile memory (e.g., ROM), or flash memory, an antenna 822, a display device 806, a battery/power 814, an audio output device 808, an audio input device 818, a global positioning system (GPS) device 816, an other output device 810 (such as video output), and other input device 820 (such as video input), a security interface device 821, and/or a test device. In one embodiment, a heat regulation/refrigeration device 811 is included and is coupled to the board, e.g., a device including actively cooled copper channels.

The communication chip 812 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 812 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 812. For instance, a first communication chip 812 may be dedicated to shorter range wireless communications such as Wi-Fi and Bluetooth and a second communication chip 812 may be dedicated to longer range wireless communications such as GPS, EDGE, GPRS, CDMA, WiMAX, LTE, Ev-DO, and others.

The processing device 802 of the computing device 800 can include an integrated circuit die in a package. The processing device 802 may include one or more structures, such as gate-all-around integrated circuit structures having hybrid interconnect architectures, built in accordance with implementations of embodiments of the present disclosure. The term "processing device" may refer to any device or portion of a device that processes electronic data from registers and/or memory to transform that electronic data into other electronic data that may be stored in registers and/or memory.

Figure 8B:
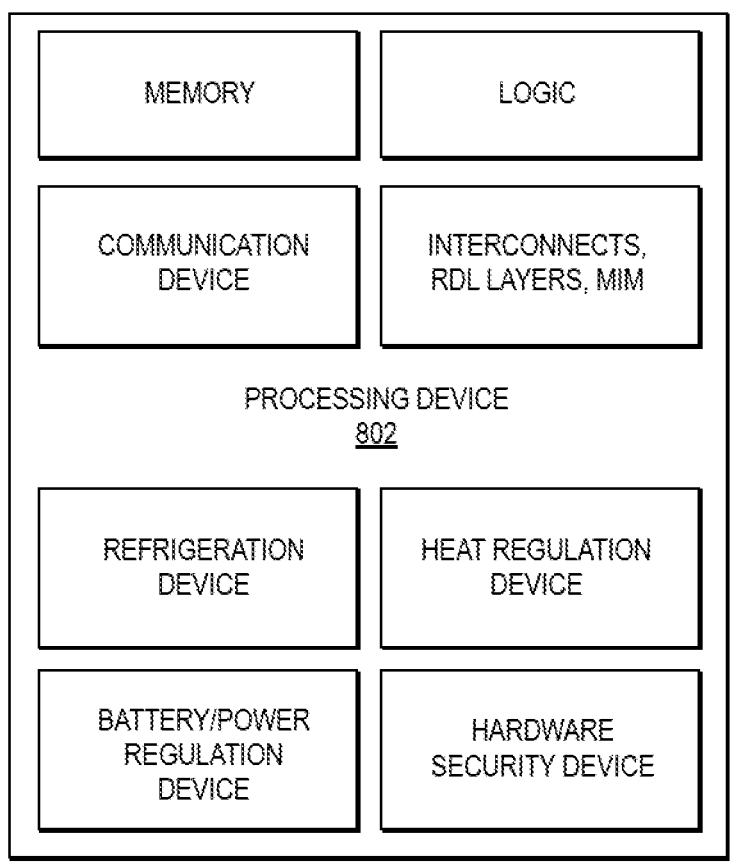
FIG. 8B illustrates a processing device in accordance with one implementation of an embodiment of the present disclosure.

FIG. 8B illustrates a processing device in accordance with one implementation of an embodiment of the present disclosure. Referring to FIG. 8B, an exemplary processing device 802 includes a memory region, a logic region, a communication device region, an interconnects and redistribution layer (RDL) and metal-insulator-metal (MIM) region, a refrigeration device region, a heat regulation device region, a batter/power regulation device region and a hardware security device region. In one embodiment, the refrigeration device region and/or the heat regulation device region is a region including actively cooled copper channels.

Thus, embodiments of the present disclosure include integrated circuit structures having hybrid interconnect architectures, and methods of fabricating integrated circuit structures having hybrid interconnect architectures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: an integrated circuit structure, comprising: an interlayer dielectric (ILD); and an interconnect over the ILD, wherein the interconnect comprises: a plurality of first layers, wherein each of the first layers comprise a metal; a plurality of second layers, wherein each of the second layers comprise a two-dimensional (2D) material, and wherein first layers and second layers are stacked over each other in an alternating pattern.

Example 2: the integrated circuit structure of Example 1, wherein the 2D material is a semi-metal.

Example 3: the integrated circuit structure of Example 1, wherein the 2D material is a transition metal dichalcogenide (TMD).

Example 4: the integrated circuit structure of Example 3, wherein the first layers comprise a transition metal, and wherein the TMD comprises the transition metal.

Example 5: the integrated circuit structure of Examples 1-4, wherein sidewalls of the interconnect are vertical.

Example 6: the integrated circuit structure of Examples 1-4, wherein sidewalls of the interconnect are tapered.

Example 7: the integrated circuit structure of Example 6, wherein a top surface of the interconnect is wider than a bottom surface of the interconnect.

Example 8: the integrated circuit structure of Example 6, wherein a top surface of the interconnect is narrower than a bottom surface of the interconnect.

Example 9: the integrated circuit structure of Examples 1-8, wherein the plurality of second layers comprises three or more second layers.

Example 10: the integrated circuit structure of Examples 1-9, wherein the plurality of first layers each have a first thickness, and wherein the plurality of second layers each have a second thickness that is less than the first thickness.

Example 11: the integrated circuit structure of Example 10, wherein the first thickness is between approximately 1 nm and approximately 50 nm, and wherein the second thickness is approximately 2 nm or less.

Example 12: the integrated circuit structure of Examples 1-11, wherein the plurality of second layers comprises at least a second layer with a first material composition and a second layer with a second material composition that is different than the first material composition.

Example 13: an integrated circuit structure, comprising: a device layer; and an interconnect coupled to the device layer, wherein the interconnect comprises: a first layer, wherein the first layer comprises a metal; a second layer over the first layer, wherein the second layer comprises a two-dimensional (2D) material; a third layer over the second layer, wherein the third layer comprises the metal; and a fourth layer over the third layer, wherein the fourth layer comprises the 2D material.

Example 14: the integrated circuit structure of Example 13, wherein the interconnect is in a front-side layer of the device layer.

Example 15: the integrated circuit structure of Example 13, wherein the interconnect is in a backside layer of the device layer.

Example 16: the integrated circuit structure of Examples 13-15, wherein the device layer comprises nanowires, nanoribbons, nanosheets, or fins.

Example 17: a computing device, comprising: a board; and a component coupled to the board, the component including an integrated circuit structure, comprising: a device layer comprising nanowire-based transistors, nanoribbon-based transistors, nanosheet-based transistors, or fin-based transistors; and a plurality of metal layers on a backside or a front-side of the device layer, wherein one or more of the metal layers comprises: a hybrid interconnect with a superlattice of first layers that are metal and second layers that are a two-dimensional (2D) material.

Example 18: the computing device of Example 17, further comprising: a memory coupled to the board.

Example 19: the computing device of Example 17 or Example 18, further comprising: a communication chip coupled to the board.

Example 20: the computing device of Examples 17-19, wherein the 2D material comprises a semi-metal or a transition metal dichalcogenide (TMD).

What is claimed is:

1. An integrated circuit structure, comprising:
an interlayer dielectric (ILD); and
an interconnect over the ILD, wherein the interconnect comprises:
a plurality of first layers, wherein each of the first layers comprise a metal;
a plurality of second layers, wherein each of the second layers comprise a two-dimensional (2D) material, wherein the 2D material is a transition metal dichalcogenide (TMD), and wherein first layers and second layers are stacked over each other in an alternating pattern.

2. The integrated circuit structure of claim 1, wherein the first layers comprise a transition metal, and wherein the TMD comprises the transition metal.

3. The integrated circuit structure of claim 1, wherein sidewalls of the interconnect are vertical.

4. The integrated circuit structure of claim 1, wherein sidewalls of the interconnect are tapered.

5. The integrated circuit structure of claim 4, wherein a top surface of the interconnect is wider than a bottom surface of the interconnect.

6. The integrated circuit structure of claim 4, wherein a top surface of the interconnect is narrower than a bottom surface of the interconnect.

7. The integrated circuit structure of claim 1, wherein the plurality of second layers comprises three or more second layers.

8. The integrated circuit structure of claim 1, wherein the plurality of first layers each have a first thickness, and wherein the plurality of second layers each have a second thickness that is less than the first thickness.

9. The integrated circuit structure of claim 8, wherein the first thickness is between approximately 1 nm and approximately 50 nm, and wherein the second thickness is approximately 2 nm or less.

10. The integrated circuit structure of claim 1, wherein the plurality of second layers comprises at least a second layer with a first material composition and a second layer with a second material composition that is different than the first material composition.

11. An integrated circuit structure, comprising:
an interlayer dielectric (ILD); and
an interconnect over the ILD, wherein the interconnect comprises:
   a plurality of first layers, wherein each of the first layers comprise a metal;
   a plurality of second layers, wherein each of the second layers comprise a two-dimensional (2D) material, and wherein first layers and second layers are stacked over each other in an alternating pattern, wherein the plurality of second layers comprises at least a second layer with a first material composition and a second layer with a second material composition that is different than the first material composition.

12. The integrated circuit structure of claim 11, wherein the 2D material is a semi-metal.

13. The integrated circuit structure of claim 11, wherein the 2D material is a transition metal dichalcogenide (TMD), and wherein the first layers comprise a transition metal, and wherein the TMD comprises the transition metal.

14. The integrated circuit structure of claim 11, wherein sidewalls of the interconnect are vertical.

15. The integrated circuit structure of claim 11, wherein sidewalls of the interconnect are tapered.

16. The integrated circuit structure of claim 15, wherein a top surface of the interconnect is wider than a bottom surface of the interconnect.

17. The integrated circuit structure of claim 15, wherein a top surface of the interconnect is narrower than a bottom surface of the interconnect.

18. The integrated circuit structure of claim 11, wherein the plurality of second layers comprises three or more second layers.

19. The integrated circuit structure of claim 11, wherein the plurality of first layers each have a first thickness, and wherein the plurality of second layers each have a second thickness that is less than the first thickness.

20. The integrated circuit structure of claim 19, wherein the first thickness is between approximately 1 nm and approximately 50 nm, and wherein the second thickness is approximately 2 nm or less.

\* \* \* \* \*